United States Patent
Kuo et al.

(10) Patent No.: US 7,145,968 B2
(45) Date of Patent: Dec. 5, 2006

(54) VITERBI DECODER OF PARTIAL RESPONSE MAXIMUM LIKELIHOOD CHANNEL

(75) Inventors: Hung-Cheng Kuo, Hsinchu (TW); Ming-Hsien Tsai, Kaohsung (TW)

(73) Assignee: MediaTek Inc., Hsinchu (TW)

( * ) Notice: Subject to any disclaimer, the term of this patent is extended or adjusted under 35 U.S.C. 154(b) by 891 days.

(21) Appl. No.: 10/063,783

(22) Filed: May 13, 2002

(65) Prior Publication Data
US 2003/0210753 A1    Nov. 13, 2003

(51) Int. Cl.
*H04L 27/06* (2006.01)
(52) U.S. Cl. ............... 375/341; 375/262; 714/795; 714/796
(58) Field of Classification Search ....... 375/341, 375/340, 316, 324, 265, 262; 714/794, 795, 714/796; 360/59.22
See application file for complete search history.

(56) References Cited
U.S. PATENT DOCUMENTS
5,802,116 A * 9/1998 Baker et al. ............ 375/341
6,101,227 A    8/2000 Glover

OTHER PUBLICATIONS

Error Control Systems for Digital Communication and Storage, Stephen B. Wicker, 1995, pp. 296-297.
IEEE Optical Data Storage, 2000 Conference Digest 2000, pp. 21-23.

* cited by examiner

*Primary Examiner*—Temesghen Ghebretinsae
(74) *Attorney, Agent, or Firm*—Jiang Chyun IP Office (57) ABSTRACT

A Viterbi decoder of a partial response maximum likelihood channel. In an optical disc drive, a system of partial response maximum likelihood has an analog/digital converter. This analog/digital converter receives an analog signal and outputs a digital signal to a Viterbi decoder. The Viterbi decoder has an adaptive level Viterbi decoder, a signal level mapping algorithm, a received signal delay chain, a hard decoder, and a multiplexer. The adaptive level Viterbi decoder and the hard decoder receive a digital signal output from the analog/digital converter to decode simultaneously. Whether the output of the multiplexer is the decision bit of the adaptive level Viterbi decoder or the hard decoder is determined by the mode selection algorithm.

7 Claims, 12 Drawing Sheets

VITERBI DECODER OF PARTIAL RESPONSE MAXIMUM LIKELIHOOD CHANNEL

BACKGROUND OF INVENTION

1. Field of the Invention

The invention relates in general to a Viterbi decoder in an optical disc system. More particularly, the invention relates to a Viterbi decoder having two different decoding modes in an optical disc system.

2. Description of the Related Art

Figure 1A:
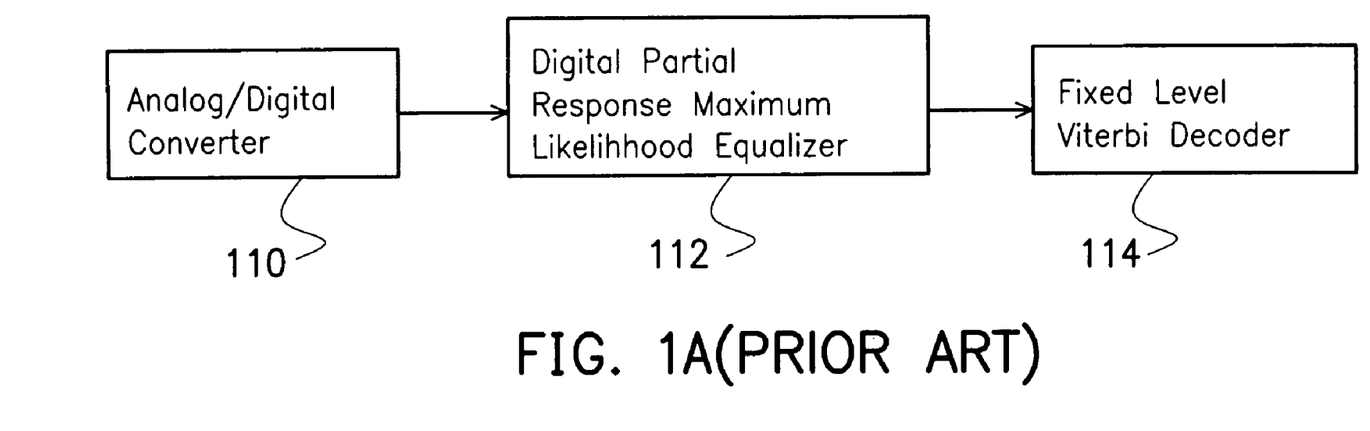
FIG. 1A is a block diagram of a conventional fixed level Viterbi decoder that has a digital partial response maximum likelihood equalizer.
Figure 1B:
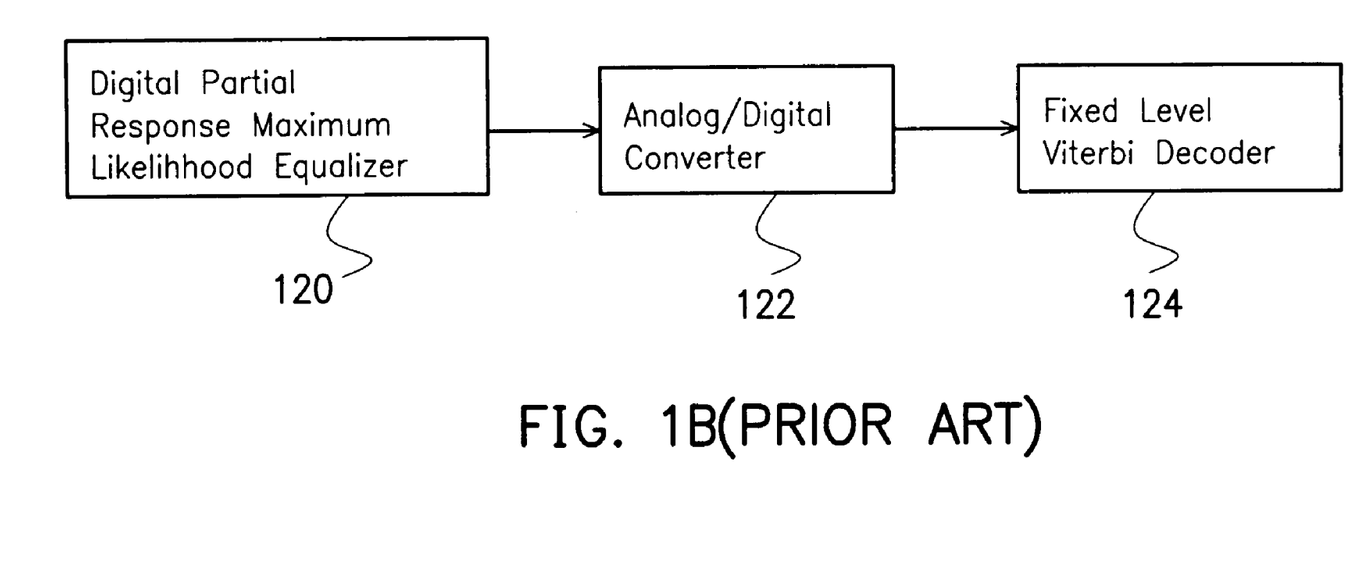
FIG. 1B is a block diagram of a conventional fixed level Viterbi decoder that has an analog partial response maximum likelihood equalizer.

In a partial response maximum likelihood (PRML) system of an optical disc system, such as a digital video disc (DVD) player, a transmission channel with a memory can be described by a trellis diagram. As shown in FIG. 1A, a block diagram of a conventional fixed level Viterbi decoder with a digital partial response maximum likelihood equalizer is illustrated. The data of a compact disc is read by an optical reading system (not shown) and sent to the analog/digital converter 110. The read data is converted from analog to digital, and sent to the fixed level Viterbi decoder 114 via the digital partial response maximum likelihood equalizer 112. In another method as shown in FIG. 1B, the data of compact disc read by an optical reading system is sent to the analog/digital converter 122 via the analog partial response maximum likelihood equalizer 120. Being converted from analog to digital, the data is then sent to the fixed level Viterbi decoder 124.

In both FIGS. 1A and 1B, a fixed signal level mode is used in the conventional Viterbi decoder. The drawback of this mode is that the partial response maximum likelihood adaptive equalizer is required, and it is difficult to design such partial response maximum likelihood equalizer. To have signal level of the Viterbi decoder suitable for decision feedback method, the convergence time is concerned. Especially, the capability and speed to mend the defects of the received signal are the major problems.

Figure 1C:
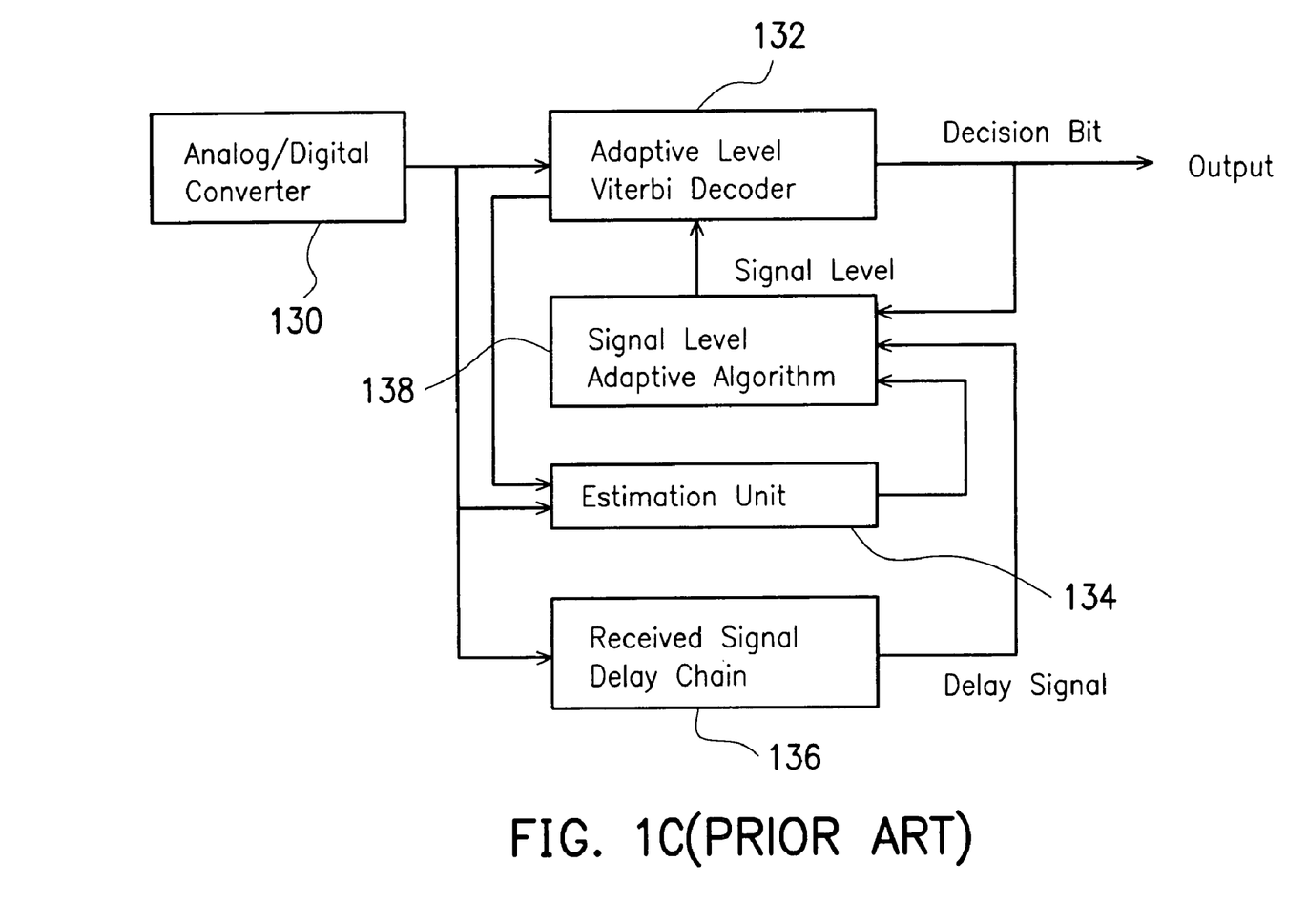
FIG. 1C is a block diagram of a conventional Viterbi decoder with an adaptive signal level.

FIG. 1C shows a block diagram of a conventional Viterbi decoder with an adaptive signal level. In FIG. 1C, the data of a compact disc read by an optical reading system is sent to the analog/digital converter 130. The analog/digital converter 130 converts the analog data into digital analog which is sent to the adaptive level Viterbi decoder 132, the estimation unit 134 and the received signal delay chain 136 simultaneously. The estimation unit 134 is used as a decision mechanism. The signal level adaptive algorithm 138 receives the decision bit output by the adaptive level Viterbi decoder 132, the decision bit output by the estimation unit 134, and the delay signal output by the received signal delay chain 136. A signal level is then output to the adaptive level Viterbi decoder 132.

As mentioned above, the signal of the Viterbi decoder is adaptable. However, the adaption has to be delayed until the Viterbi decoder decodes the received signal. Thus, the training cycle is long, and a large amount of registers have to be used to store the delay signals. When serial errors occurs to the Viterbi decoder, a very long time is consumed to mend the internal operation sequence of the Viterbi decoder.

SUMMARY OF INVENTION

The invention provides a Viterbi decoder of a partial response maximum likelihood channel. In such decoder, not a large amount of registers is used. It can also shorten the time consumed for mending the errors caused by continuous decoding operation.

The partial response maximum likelihood system in the optical disc system comprises an analog/digital converter. The analog/digital converter receives an analog signal and outputs a digital signal to the Viterbi decoder. In the Viterbi decoder, an adaptive level Viterbi decoder, according to a signal level, operates the received digital signal to obtain a decision bit and a survivor metrics. The decision bit and the survivor metrics then are output. A signal level mapping algorithm is used to receive a delay signal and a path-confirm information. The delay signal and the path-confirm information are operated in judging and statistic and the signal level is obtained. The signal level mapping algorithm outputs the signal level. A received signal delay chain is used to receive the digital signal, which is delayed to have a delay signal, wherein the received signal delay chain can output the delay signal. A hard decoder is used to receive the digital signal and quantize, compare, and determine the path, so as to obtain the decision bit and the path-confirm information. The hard decoder can output the decision bit and the path-confirm information. A mode selection algorithm is used to receive the decision bit the survivor metrics output from the Viterbi decoder and receive the decision bit output from the hard decoder, and then obtain a selection signal after calculation and comparison. The mode selection algorithm can output the selection signal. A multiplexer is used to receive the selection signal and decide to output one of the decision bits from the the adaptive level Viterbi decoder and the hard decoder.

The Viterbi decoder of a partial response maximum likelihood channel uses the level adaptive Viterbi decoder and the hard decoder to decode a digital signal simultaneously. A mode selection algorithm is used to select the decoder with the optimum decoding condition currently to output an optimum decoding result. Thus, without using a large amount of registers and consuming a long mending time for serial decoding errors, the operation can be performed.

Both the foregoing general description and the following detailed description are exemplary and explanatory only and are not restrictive of the invention, as claimed.

DETAILED DESCRIPTION

Figure 2:
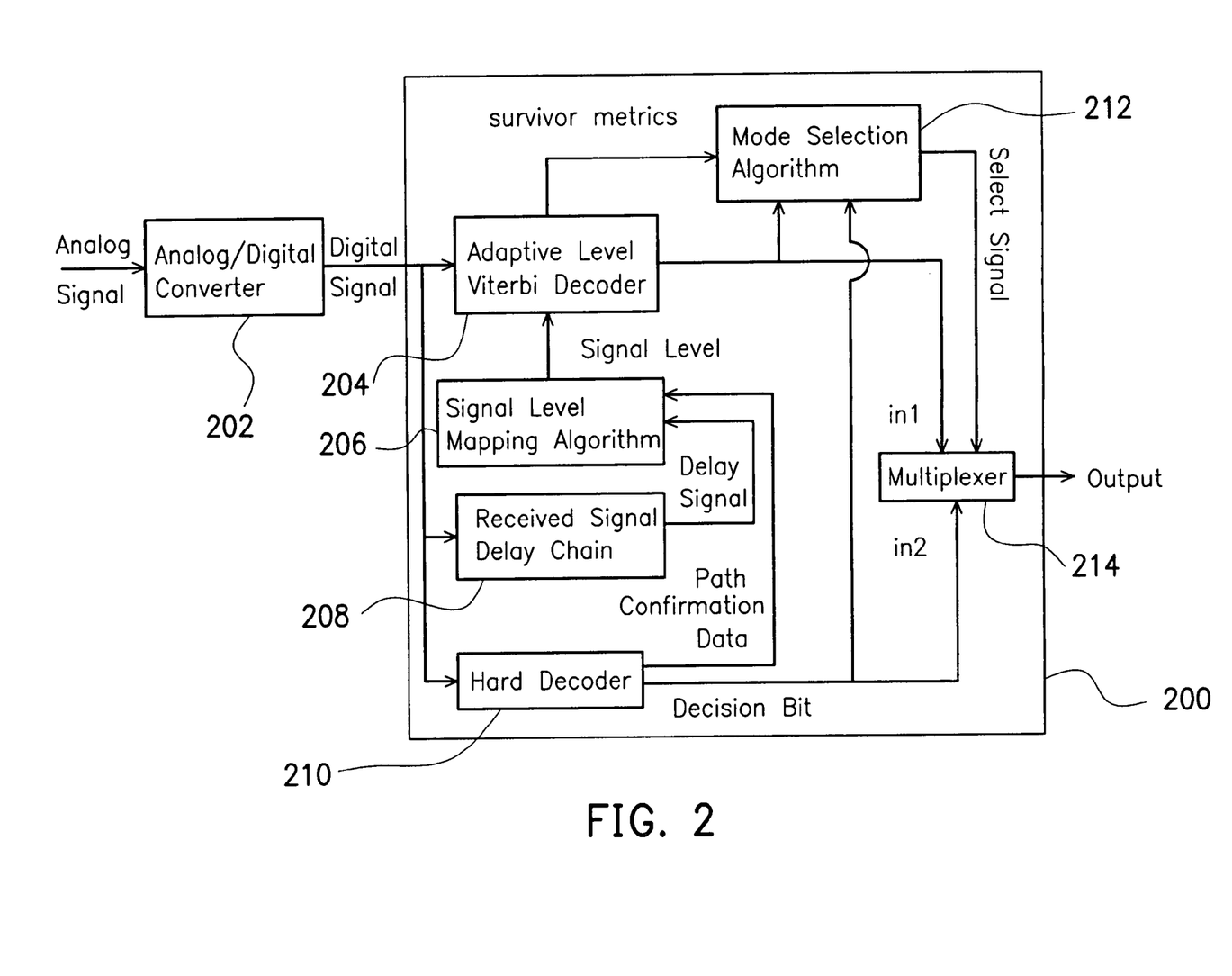
FIG. 2 shows a Viterbi decoder provided by the invention.

FIG. 4 shows a Viterbi decoder provided by the invention. In FIG. 2, the partial response maximum likelihood system of the optical disc system comprises an analog/digital converter 202. A data read from a compact disc by an optical reading system (not shown) is input and converted by the analog/digital converter 202, which then converts the analog data to a digital data to be output to the Viterbi decoder 200. The Viterbi decoder 200 comprises elements as follows.

An adaptive level Viterbi decoder 204 has a digital signal input terminal to receive the digital signal output by the analog/digital converter 202. A signal level input terminal of the adaptive level Viterbi decoder 204 is to receive a signal level. The adaptive level Viterbi decoder 204, according to the signal level, performs an operation on the received digital signal, so as to obtain a decision bit and a quantity of survivor metrics. An output terminal of the survivor metrics outputs the quantity of the survivor metrics and the the decision bit is output from the output terminal of decision bit.

A signal level mapping algorithm 206 comprises a delay signal input terminal to receive a delay signal, a path-confirm information input terminal to receive a path-confirm information. The signal level mapping algorithm 206 obtains the signal level by performing judging and statistic on the delay signal and the path-confirm information. A signal level output terminal is to output a signal level to the signal level input terminal of the Viterbi decoder 204.

A received signal delay chain 208 comprises a digital signal input terminal to receive the digital signal output by the analog/digital converter 202, wherein the digital signal is delayed to have the delay signal, a delay signal output terminal is used to output the delay signal to the delay signal input terminal of the signal level mapping algorithm 206.

A hard decoder 210 comprises a digital signal input terminal to receive the digital signal output by the analog/digital converter 202. The hard decoder 210 receives the digital signal and performs quantizing, comparing, and determining a path, so as to obtain the decision bit and the path-confirm information. The path-confirm information output terminal outputs the path-confirm information to a path-confirm information input terminal of the signal level mapping algorithm 206. The hard decoder 210 further comprises a decision bit output terminal to output the decision bit.

A mode selection algorithm 212 comprises a survivor metric input terminal to receive the survivor metric output by the survivor metric output terminal. A first decision bit input terminal and a second decision bit input terminal receive the decision bits output by the decision output terminals of the adaptive level Viterbi decoder 204 and the hard decoder, respectively. The mode selection algorithm 211 receives the decision bit and the survivor metrics from the adaptive level Viterbi decoder 204 and the decision bit from the hard decoder 210 and performs operation of calculation and comparison, so as to obtain a selection signal outputting from a selection signal output terminal.

A multiplexer 214 comprises an input terminal in1 to receive the decision bit output by the decision bit output terminal of the adaptive level Viterbi decoder 204, and a second input terminal in2 to receive the decision bit output by the decision bit output terminal of the hard decoder 210. The multiplexer 214 further comprises a selection signal input terminal to receive the selection signal output by the selection signal output terminal of the mode selection algorithm 212. The multiplexer 214, according to the selection signal, decide one of the decision bits output from the adaptive level Viterbi decoder 204 or the hard decoder 210.

The adaptive level Viterbi decoder 204 and the hard decoder 210 receive the digital signals output by the analog/digital converter 202 simultaneously for decoding. The mode selection algorithm 212 determines whether the decision bit output by the adaptive level Viterbi decoder 204 or the decision bit output by the hard decoder 210 is output by the multiplexer 214. The mode selection algorithm 212 compare the decision bit output by the adaptive level Viterbi decoder 204 to the decision bit output by the hard decoder 210 as a reference to calculate the bit error rate (BER). The decoding condition of the Viterbi decoder 200 can thus be determined to avoid the serial decoding errors.

Figure 3A:
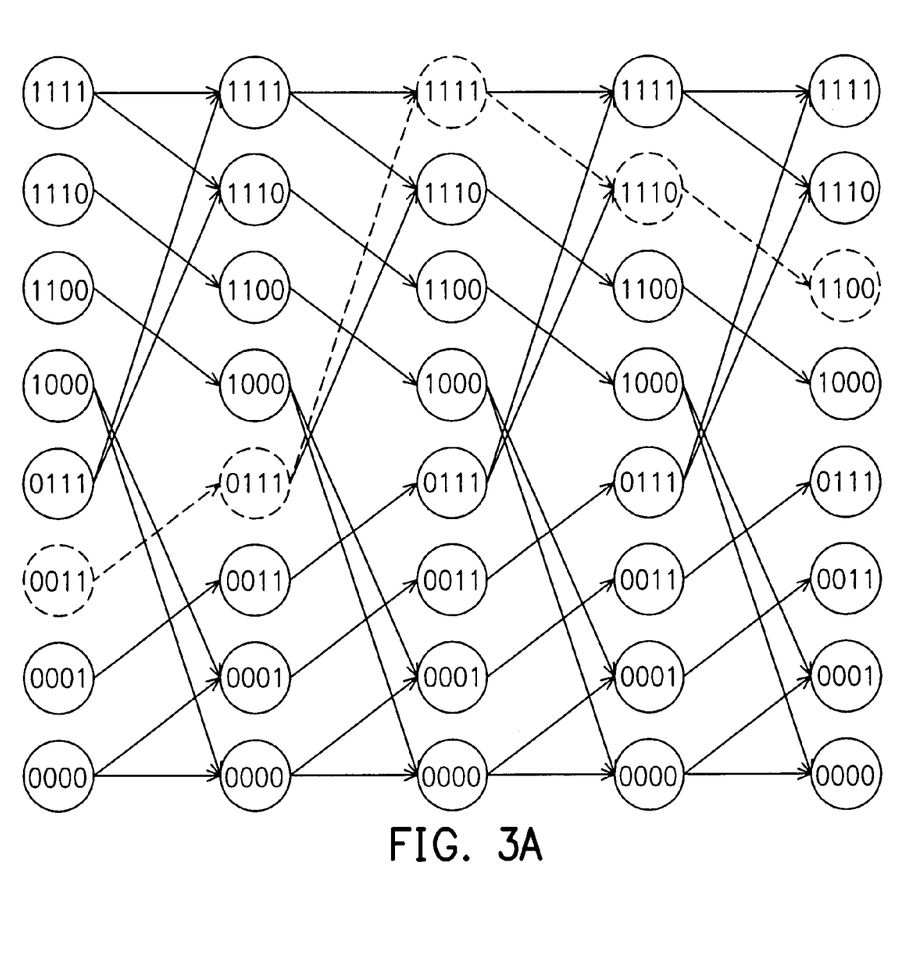
FIG. 3A shows the trellis diagram of a Viterbi decoder.
Figure 3B:
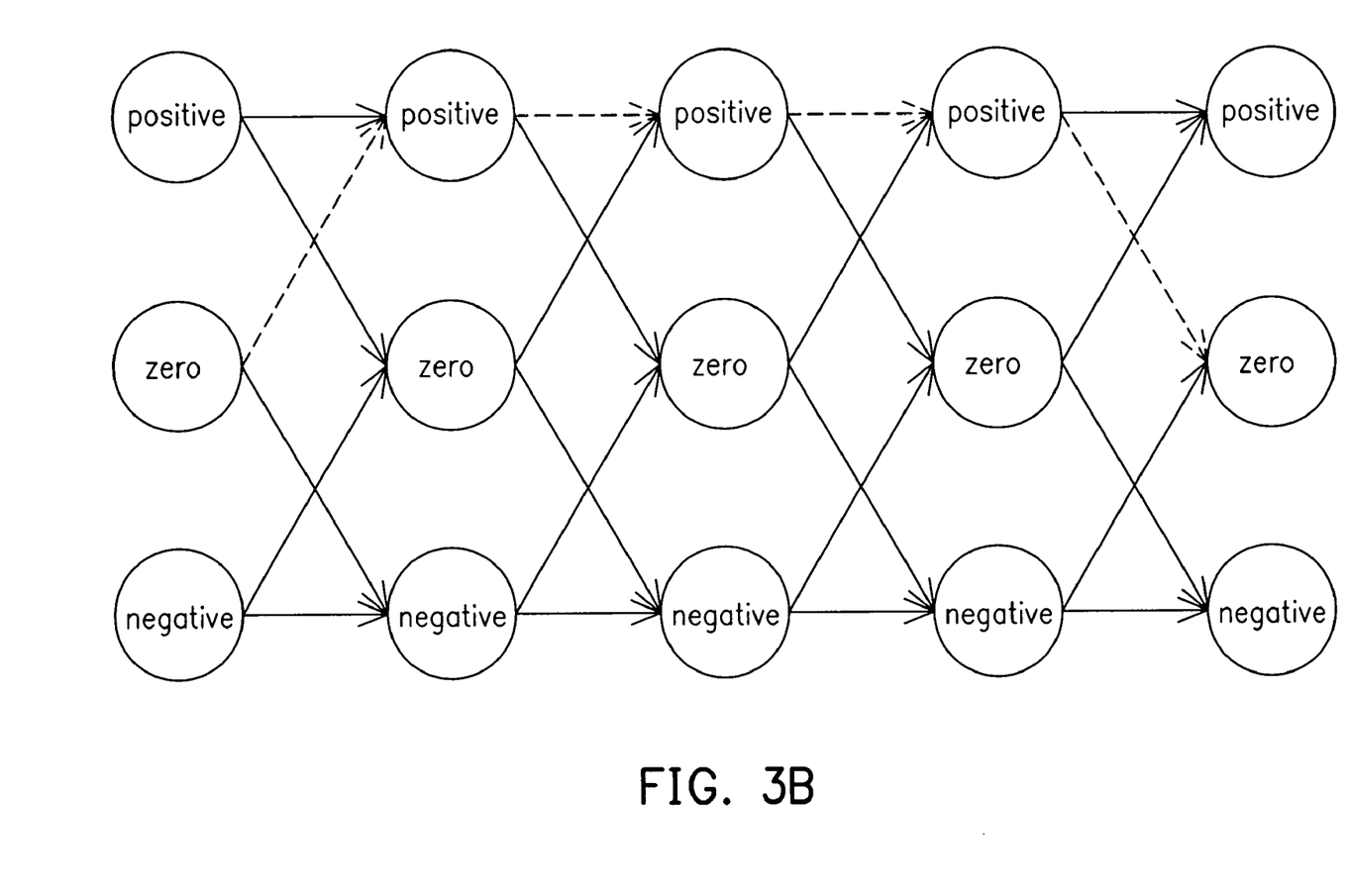
FIG. 3B shows the trellis diagram of a hard decoder.

FIG. 3A shows a trellis diagram of the Viterbi decoder. The quantization result of FIG. 3A is illustrated as the trellis diagram of the Viterbi decoder as shown in FIG. 3B. For example, the dash line in FIG. 3A is corresponding to the dash line in FIG. 3B, while the solid line in FIG. 3A is corresponding to the solid line as illustrated in FIG. 3B. Since the corresponding signal of FIG. 3A is the same as that of FIG. 3B, the path of FIG. 3B corresponds to the path of FIG. 3B after being decoding. Thus correspondence is called "path-confirm information".

Figure 4:
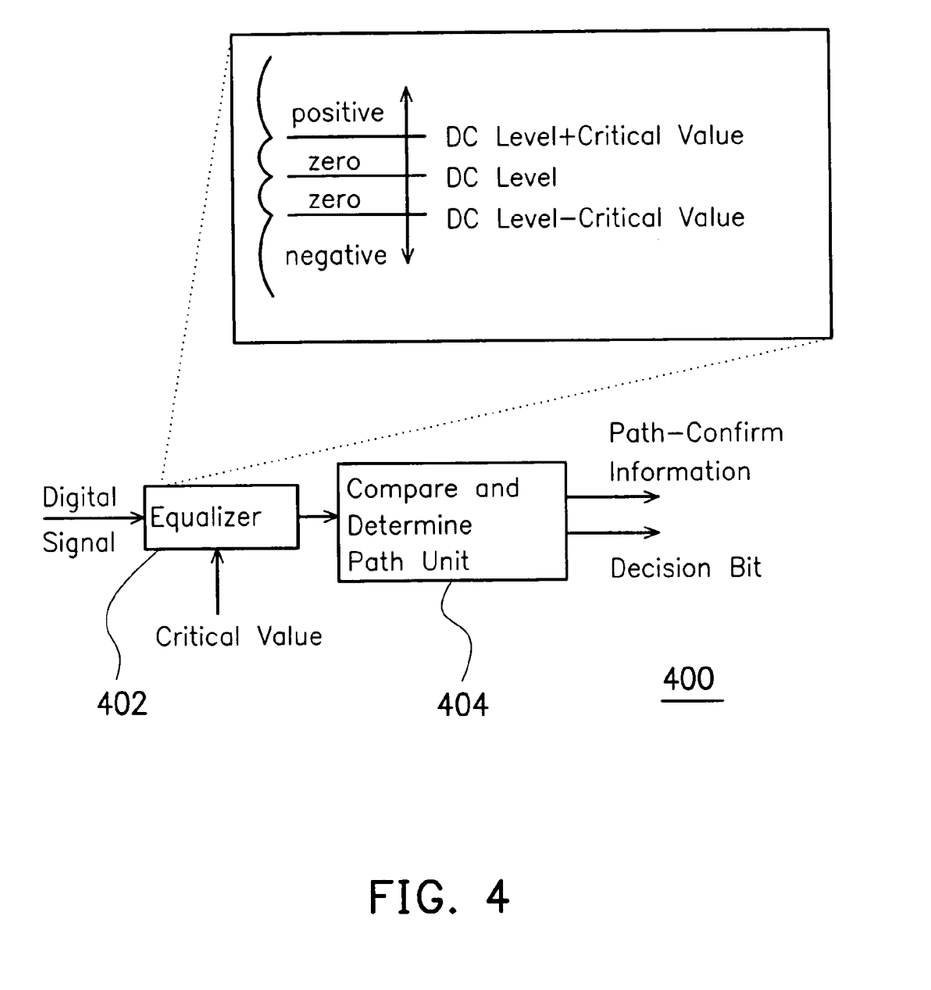
FIG. 4 shows a block diagram of a hard decoder.

FIG. 4 shows a block diagram of the hard decoder. Referring to both FIG. 3B and FIG. 4, the hard decoder 402 comprises an equalizer 402 and a compare and determine path unit 404. The equalizer 402 receives the digital signal output by an analog/digital converter (not shown in the figures) and a threshold to output a "positive", "zero" or "negative" signal to the compare and determine path unit 404. The compare and determine path unit 404 then outputs a path-confirm information to the signal level mapping algorithm and a decision unit to the mode selection algorithm and the multiplexer.

In FIG. 4, the equalizer 402 quantizes the received digital signal. For example, when the digital signal is smaller than the threshold, the digital signal is quantized to a level of "zero". When the absolute value of the digital signal is larger than "DC+threshold", the digital signal is quantized to the "positive" level. When the absolute value of the digital signal is smaller than "DC+threshold", the digital signal is quantized to a "negative" level.

Figure 5:
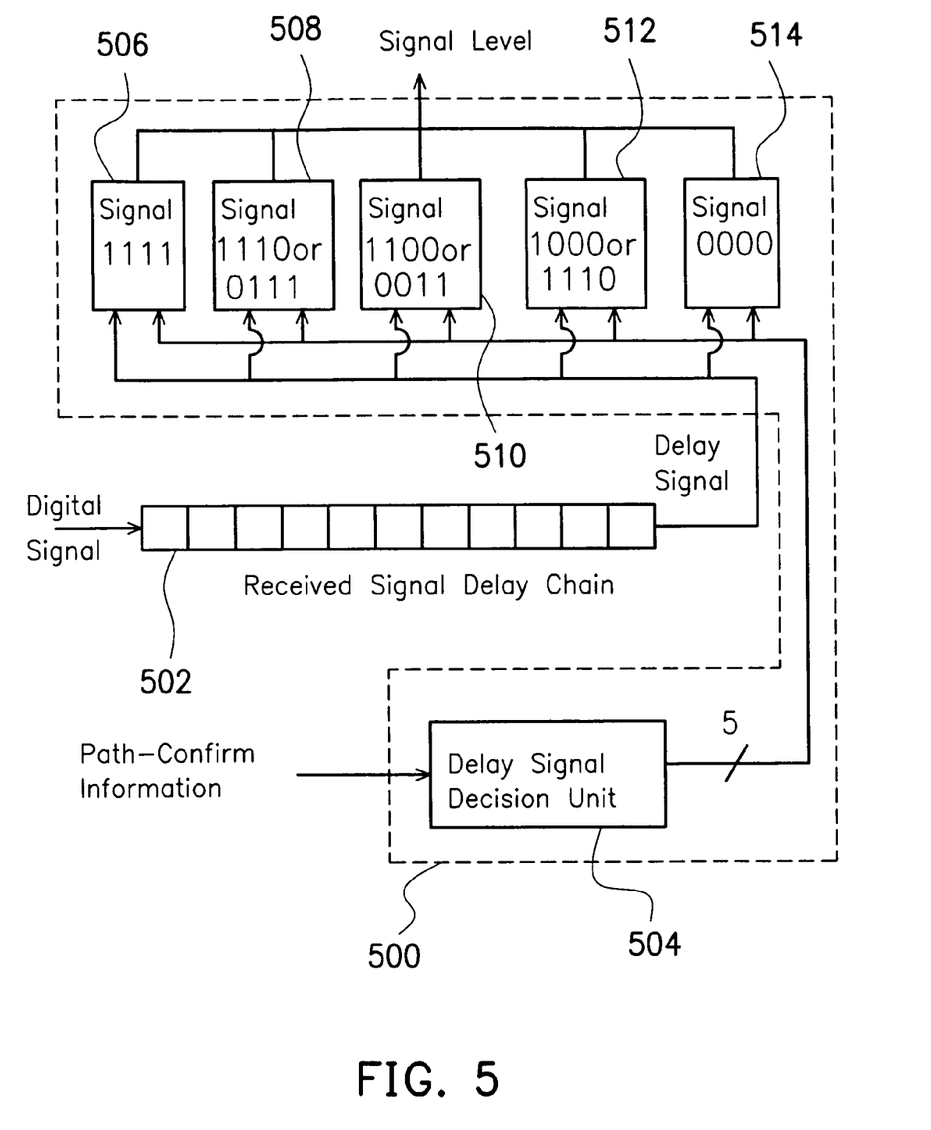
FIG. 5 shows a block diagram of a signal level mapping algorithm and a received signal delay chain.

FIG. 5 shows a block diagram of the signal level algorithm and the received signal delay chain. In FIG. 5, it is an example for the channel memory being 3 and the signal level having four bits. If the channel mode changes, then the signal level mapping algorithm 500 would change accordingly. The path-confirm information input terminal of the delay signal decision unit 504 in the signal level mapping algorithm 500 is coupled to the path-confirm information output terminal of the hard decoder (not shown in FIG. 5) to receive the path-confirm information. The delay signal decision unit 504 performs the delay and judging, so as to obtain a signal, which is output from the signal output terminal of the delay signal decision unit 504 to signal statistical units 506, 508, 510, 512 and 514.

A first statistical signal input terminal of the signal statistical units 506, 508, 510, 512 and 514 is coupled to the signal output terminal of the delay signal decision unit 504, so as to receive the output signal therefrom. A second statistical signal input terminal of the signal statistical units 506, 508, 510, 512 and 514 receives the delay signal output from the received signal delay chain 502. The signal statistical units 506, 508, 510, 512 and 514 perform the statistic operation on the signal and the delay signal, so as to obtain the signal level, which is output from the statistical signal output terminal to the adaptive level Viterbi decoder (not shown in FIG. 5).

In FIG. 5, the delay signal output from the received signal delay chain 502 is delivered to a proper signal set (that is, the signal statistical units 506–514). All the signal levels in each signal set calculate the counts. Which signal set does the current delay signal belongs to in the signal level mapping algorithm 500 is a simple mapping table.

Figure 6:
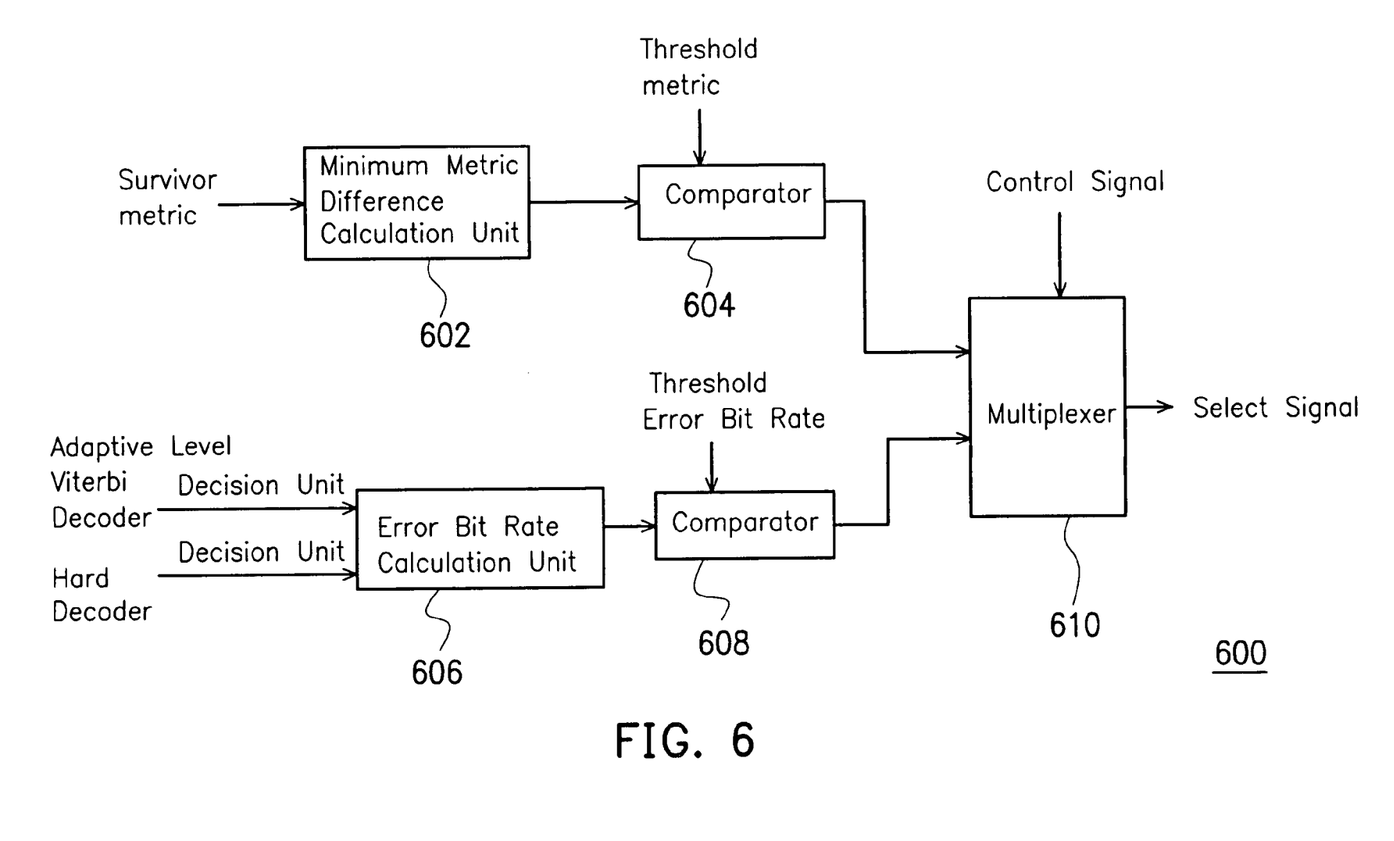
FIG. 6 shows a block diagram of a mode selection algorithm.

FIG. 6 is a block diagram of the mode selection algorithm. In FIG. 6, the model selection algorithm 600 comprises a minimum metric difference calculation unit 602 of which an input terminal receives the survivor metric output from the adaptive level Viterbi decoder (not shown in FIG. 6). After calculation, the minimum metric difference calculation unit 602 outputs a difference signal.

The comparator 604 has a first compare input terminal to receive the difference signal output from the output terminal of the minimum metric difference calculation unit 602. A second compare input terminal receives a threshold metric. After comparison, a comparison signal is output from the compare output terminal of the comparator 604.

The error bit calculation unit 606 comprises a first input terminal to receive the decision unit output by the adaptive level Viterbi decoder (not shown in FIG. 6). A second input terminal of the error bit calculation unit 606 receives the decision bit output by the hard decoder (not shown in FIG. 6). After calculation, an output terminal of the error bit calculation unit 606 outputs an error bit rate signal.

The comparator 608 comprises a first compare input terminal to receive the error bit rate signal output by the error bit calculation unit 606, a second compare input terminal to receive a threshold error bit rate. After comparison, a compare output terminal of the comparator 608 outputs a compare signal.

The multiplexer 610 comprises a first input terminal to receive the compare signal output by the comparator 604 and a second input terminal to receive the compare signal output by the comparator 608. A control terminal of the multiplexer 610 is to receive a control signal, which is used to decide a select signal of the multiplexer 214 at the output terminal.

In FIG. 6, any stage in the trellis diagram (referring to FIG. 3A), if the difference between the optimum survivor metric and any survivor is small, the channel condition (that is, the operation condition of Viterbi decoder) is poor, the system confusion is caused. To determine whether the channel condition is good, the error bit rate obtained by comparing the decision bits of the Viterbi decoder and the hard decoder can be referred. When a serial decoding error of the Viterbi decoder is obtained, it is determined by the decision bit output by the hard decoder. In contrast, when a serial decoding error happens to the hard decoder, the decision bit output by the Viterbi decoder.

Figure 7:
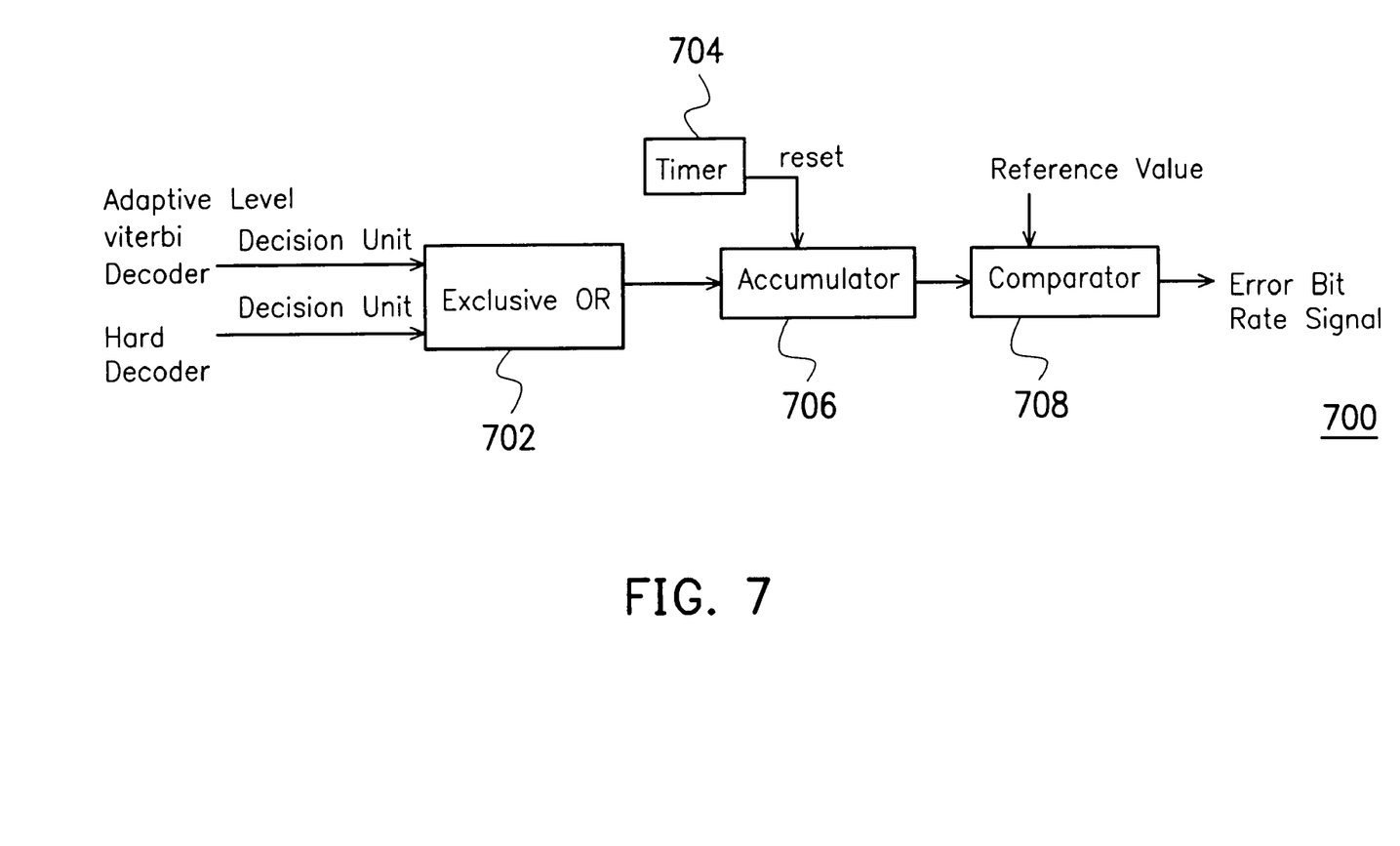
FIG. 7 shows a block diagram of a bit error rate calculation unit.

FIG. 7 is a block diagram of an error bit rate calculation unit. In FIG. 7, the exclusive OR 702 of the error bit rate calculation unit 700 comprises a first input terminal to receive the decision bit output by the adaptive level Viterbi decoder, a second input terminal to receive the decision bit output by the hard decoder (not shown). After a logic operation, an exclusive OR signal is obtained and is output from an output terminal of the exclusive OR 702.

The timer 704 outputs a reset signal after a predetermined period of time. The input terminal of the accumulator 706 is coupled to the output terminal of the exclusive OR 702 to receive the exclusive OR signal. The accumulator 706 comprises a reset input terminal to receive the reset signal output by the timer 704. After accumulation, an accumulate signal is obtained and output from an output terminal of the accumulator 706.

The comparator 708 comprises a first input terminal to receive the accumulate signal output by the accumulator 706, a second input terminal to receive a reference signal. After comparison, an error bit rate signal is obtained and is output to the comparator 608 from the output terminal of the comparator 708 (referring to FIG. 6).

In FIG. 7, the error bit rate calculation unit 700 typically compares the decision bits of the adaptive level Viterbi decoder and the hard decoder every certain period of time. Assuming that the timer 704 has a counting number 2048 of 11 bits, after the decision bits from the adaptive level Viterbit decoder and the hard decoder are calculated by the exclusive OR 702 and the accumulator 704, if the different bit number of the decision bits is assumed to be 512, then the error bit rate is 0.25. After calculating the error bit rate, the comparator 708 compares the reference value with the error bit rate to determine whether or not the channel condition is good. For example, when the channel condition is poor, the error bit rate is about 0.5. In contrast, when the Viterbi decoder starts functioning, the error bit rate drops to about 0.01 to about 0.001 rapidly. It should be noted that the above quantities are given as an example only for explanation. The actual quantities can be assigned according to the actual design.

Figure 8:
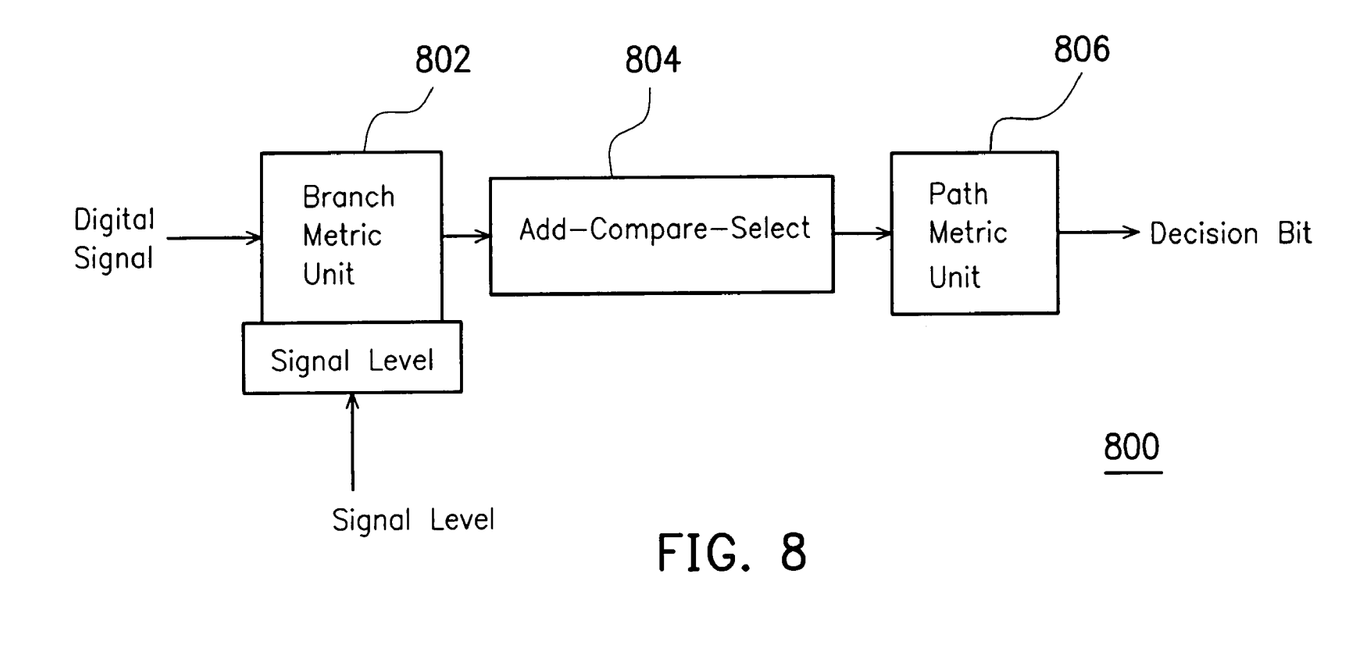
FIG. 8 shows an adaptive level Viterbi decoder.

FIG. 8 shows the adaptive level Viterbi decoder. In FIG. 8, the branch metric unit 802 of the adaptive level Viterbi decoder 800 comprises a digital input terminal to receive the digital signal output by the analog/digital converter (not shown in FIG. 8). The branch metric unit 802, according to the signal level, calculates the received digital signal and obtains a a branch metric quantity, which is output from the output terminal of the branch metric.

The add-compare-select unit 804 comprises a branch metric input terminal to receive the branch metric output by the branch metric unit 802. The add-compare-select unit 804 is used to add, compare, and select, so as to obtain a survivor metrics quantity, which is output from a survivor metric output terminal.

A path metric 806 comprises a survivor metric input terminal to receive the survivor metric quantity output by the add-compare-select unit 804. The path metric unit 806 perform operation to obtain the decision bit, which is output from a decision bit output terminal to the mode selection algorithm (not shown in FIG. 8) and the multiplexer (not shown in FIG. 8).

Figure 9:
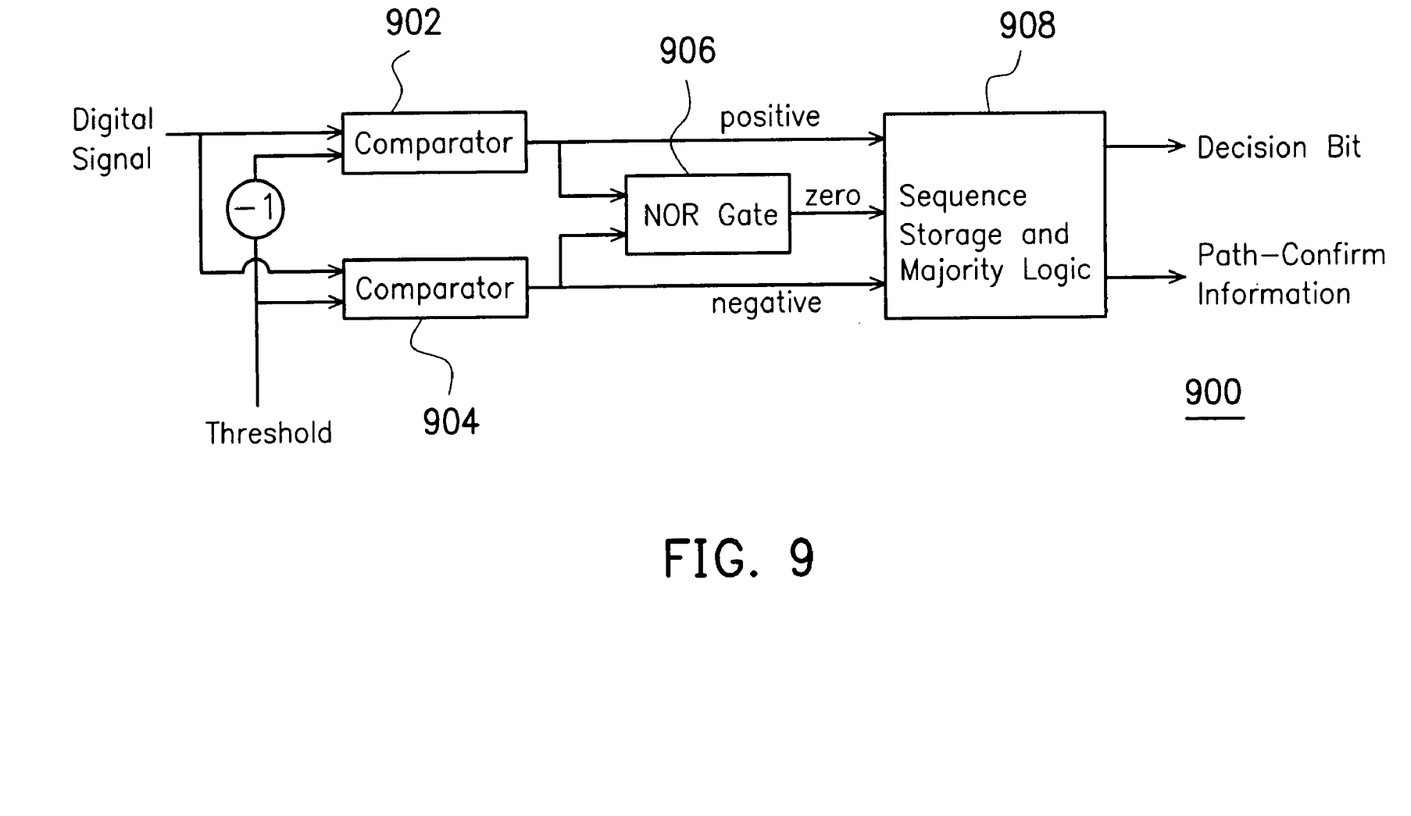
FIG. 9 is a block diagram of a hard decoder.

FIG. 9 is a block diagram of the hard decoder. In FIG. 9, the comparator 902 of the hard decoder 900 comprises a first input terminal to receive the digital signal output by the analog/digital converter, and a second input terminal to receive a threshold multiplied by a predetermined value (−1 in this embodiment). After comparing the digital signal with the threshold value, an output terminal of the comparator 902 is to output a compare signal.

A first input terminal of the comparator 904 of the hard decoder 900 receives the digital signal output by the analog/digital converter. A second input terminal of the hard decoder 900 receives the threshold. After comparing the digital signal with the threshold value, the output terminal of the harder decoder 900 outputs a compare signal.

The NOR gate 906 of the hard decoder 900 has a first and a second logic input terminals to receive the compare signals output by the first comparators 902 and 904, respectively. The NOR gate 906 further comprises two compare signals to perform a logic operation, whereby a logic output terminal outputs a logic signal.

The sequence storage and majority logic 908 has a first and a second compare input terminals to respectively receive the compare signals output by the comparator 902 and the logic signal output from the logic output terminal of the NOR gate 906. Also and, a third compare input terminal of the sequence storage and majority logic 908 receives compare signal from the compare output terminal from the comparator 904. The sequence storage and majority logic 908 performs the storage operation and logic operation, so as to obtain the decision bit and the path-confirm information. The decision bit is output from the decision bit output terminal of the sequence storage and majority logic 908 to the mode selection algorithm and the multiplexer (not shown). The path-confirm information of the sequence storage and majority logic 908 is output from the output terminal to the signal level mapping algorithm (not shown).

In FIG. 9, the digital signal output by the analog/digital converter is compared to the thresholds in comparators 902 and 904 to determine the state is "positive", "zero" or "negative". Being stored and decided by the sequence storage and majority logic 908, the decision bit is output to the mode selection algorithm and the multiplexer, while the path-confirm information is output to the signal level mapping algorithm.

Figure 10:
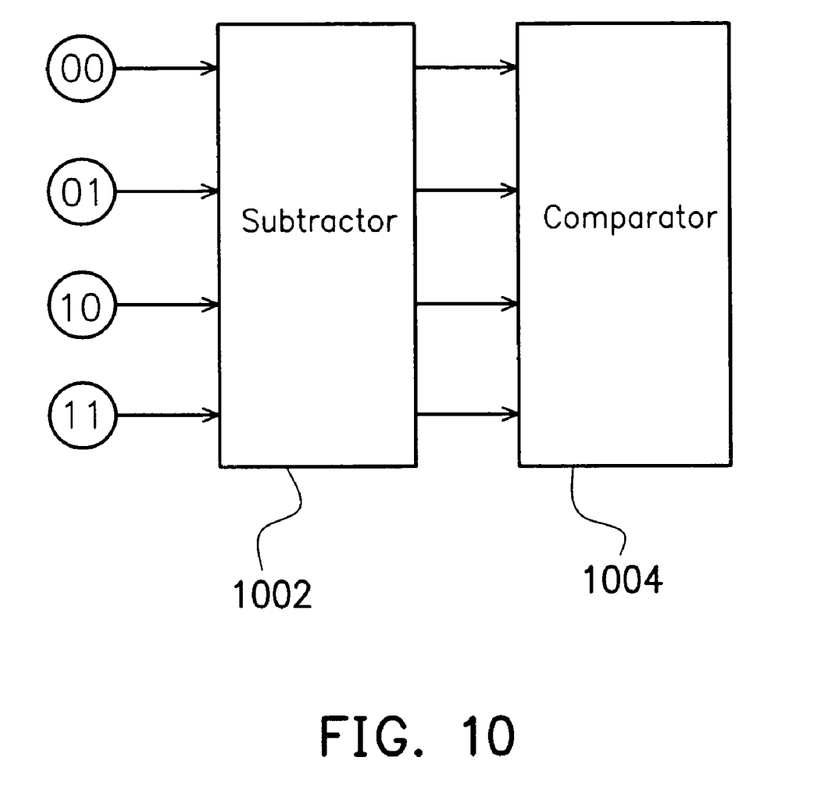
FIG. 10 is a block diagram using survivor metric for mode selection.

FIG. 10 shows a block diagram using the survivor metric for the mode selection. The mode selection algorithm can perform the mode selection according to the survivor metric output by the adaptive level Viterbi decoder. As shown in FIG. 10, for an N-state Viterbi decoder, (N−1) subtractor 1002 is used to calculate the difference between the optimum survivor metric and the survivor metric output by the adaptive level Viterbi decoder (the "00", "01", "10", "11" in FIG. 10). The (N−1) set of differences is output to the comparator 1004. The (N−1) set of difference is compared to an empirical value. If any of the (N−1) set of difference is smaller than the empirical value, it means that the channel condition is poor, so that the hard decoder is used for decoding.

Therefore, the invention provides a Viterbi decoder with partial response maximum likelihood channel. The decoding process of the digital signal is performed using both the adaptive level Viterbi decoder and the hard decoder. The mode selection algorithm is used to select the current optimum decoder, so as to output the optimum decoding result. Therefore, the Viterbi decoder does not require a large number of registers, and the time consumed for mending the serial decoding error is saved.

Other embodiments of the invention will appear to those skilled in the art from consideration of the specification and practice of the invention disclosed herein. It is intended that the specification and examples to be considered as exemplary only, with a true scope and spirit of the invention being indicated by the following claims.

The invention claimed is:

1. A Viterbi decoder of a partial response maximum likelihood channel, a partial response maximum likelihood system in an optical disc system having an analog/digital converter, which receives an analog signal and outputs a digital signal to said Viterbi decoder, said Viterbi decoder comprising:

an adaptive level Viterbi decoding unit, according to a signal level, operating said received digital signal to obtain a decision bit and a survivor metrics value, and output said decision bit and said survivor metrics value;

a signal level mapping algorithm, used to receive a delay signal and a path-confirm information, wherein said delay signal and said path-confirm information are operated with judging and statistic, so as to obtain said signal level, which can be output by said signal level mapping algorithm;

a received signal delay chain, used to receive said digital signal, said digital signal being delayed to obtain said delay signal, which can be output by said received signal delay chain;

a hard decoder, used to receive said digital signal, performing quantization, comparison, and determining path, so as to obtain said decision bit and said path-confirm information, wherein said hard decoder can output said decision bit and said path-confirm information;

a mode selection algorithm, used to receive said decision bit and said survivor metrics value output from said adaptive level Viterbi decoding unit, and said decision bit from said hard decoder, wherein after calculation and comparison, a selection signal is obtained and can be output by said mode selection algorithm; and a first multiplexer, used to receive said selection signal, which is used to determine one of said decision bits from said adaptive level Viterbi decoding unit and said hard decoder.

2. The Viterbi decoder of the partial response maximum likelihood channel according to claim 1, wherein said adaptive level Viterbi decoding unit further comprises:

a branch metric unit, according to a signal level, used to calculate said received digital signal. So as to obtain a branch metric value, which can be output by said branch metric unit;

an add-compare-select unit, used to receive said branch metric value, and perform addition, comparison, and selection, so as to obtain said branch metric value, which can be output by said add-compare-select unit; and a path metric unit, used to receive said survivor metric value and to obtain said decision bit through operation, wherein said path metric unit can output said decision bit.

3. The Viterbi decoder of the partial response maximum likelihood channel according to claim 1, wherein said hard decoder further comprises:

a first comparator, used to compare said digital signal with a threshold value and output a first comparing signal;

a second comparator, used to compare said digital signal with said threshold value and output a second comparing signal;

a logic device, used to receive said fist comparing signal and said second comparing signal, and obtain a logic signal through logic operation, wherein said logic device can output said logic signal; and a sequence storage and majority logic unit, used to receive said first comparing signal, said logic signal, and said second comparing signal, wherein after storage and logic operation, said decision bit and said path-confirm information are obtained and can be output by said sequence storage and majority logic unit.

4. The Viterbi decoder of partial response maximum likelihood channel according to claim 3, wherein said logic device comprises a NOR gate.

5. The Viterbi decoder of partial response maximum likelihood channel according to claim 1, wherein said signal level mapping algorithm further comprises:
   a delay signal decision unit, used to receive said path-confirm information and obtain a signal through delay and judging, wherein said signal can be output by said delay signal decision unit;
   a plurality of signal statistical units, used to receive said signal and said delay signal and obtain said signal level through statistic, wherein said signal statistical units can output said signal level.

6. The Viterbi decoder of partial response maximum likelihood channel according to claim 1, wherein said mode selection algorithm further comprises:
   a minimum metric difference calculation unit, used to receive said survivor metric value, and obtain a difference signal through calculation, wherein said minimum metric difference calculation unit can output said difference signal;
   a first comparator, used to receive said difference signal and a threshold metric value, and obtain a first comparing signal through comparison, wherein said first comparator outputs said first comparing signal;
   an error bit rate calculation unit, used to receive said decision bits from said adaptive level Viterbi decoding unit and said hard decoder, wherein after calculation, an error bit rate signal is obtained and outputted by said error bit rate calculation unit;
   a second comparator, used to receive said error bit rate signal and a threshold error bit rate, wherein a second comparing signal is obtained and outputted by said second comparator; and
   a first multiplexer, used to receive said first comparing signal, said second comparing signal, and a control signal, so as to determine to output said selection signal.

7. The Viterbi decoder of partial response maximum likelihood channel according to claim 6, wherein said error bit rate calculation unit further comprises:
   an exclusive OR unit, used to receive said decision bits from said adaptive level Viterbi decoding unit and said hard decoder, wherein after logic operation, an exclusive OR signal is obtained and outputted by said exclusive OR unit;
   a timer, to output a reset signal after a predetermined period of time;
   an accumulator, used to receive said exclusive OR signal and said rest signal, wherein after accumulation, an accumulation signal is obtained and outputted by the said accumulator; and
   a third comparator, used to receive said accumulation signal and a reference signal, wherein after comparison, said error bit rate signal is obtained and outputted by said third comparator.

* * * * *